(12) United States Patent
Rowan et al.

(10) Patent No.: US 6,362,766 B1
(45) Date of Patent: Mar. 26, 2002

(54) VARIABLE PULSE PWM DAC METHOD AND APPARATUS

(75) Inventors: Bryan Scott Rowan, Los Gatos; Louis Joseph Serrano; Mantle Man-Hon Yu, both of San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,357

(22) Filed: Feb. 9, 2000

(51) Int. Cl.[7] ............................................... H03M 1/82
(52) U.S. Cl. ..................................................... 341/152
(58) Field of Search ......................................... 341/152

(56) References Cited

U.S. PATENT DOCUMENTS

| | | | | |
|---|---|---|---|---|
| 3,836,908 A | * | 9/1974 | Hegendorfer | 341/152 |
| 4,258,355 A | * | 3/1981 | Edwards | 341/145 |
| 5,043,729 A | * | 8/1991 | Fujimoto | 341/152 |
| 6,172,633 B1 | * | 1/2001 | Rodgers et al. | 341/152 |
| 6,181,266 B1 | * | 1/2001 | Toki | 341/152 |

* cited by examiner

*Primary Examiner*—Howard L. Williams
(74) *Attorney, Agent, or Firm*—Randall J. Bluestone

(57) ABSTRACT

A variable pulse pulse width modulation digital-to-analog converter comprising: an input code register to store a digital input code to be converted; a PWM decoder, coupled to the input code register, to convert the input code to a series of pulses; an output driver circuit coupled to the PWM decoder, wherein the output driver circuit generates an output signal comprising pulses of a high logic level and pulses of an intermediate logic level; and a filter to integrate the pulses to generate an analog output value corresponding to the digital input code. In one embodiment, the output stage comprises an active tri-state driver, a multiplexer and at least two output reference voltage sources. Using a plurality of different amplitude pulse levels enables PWM DACs according to the present invention to provide greater resolution than conventional PWM DACs for a given clock frequency and conversion period.

20 Claims, 6 Drawing Sheets

VARIABLE PULSE PWM DAC METHOD AND APPARATUS

BACKGROUND OF THE INVENTION

1. Field of the Invention

The present invention relates to digital-to-analog converters, and more particularly to pulse width modulation digital-to-analog converters.

2. Description of Related Art

Digital-to-analog converters (DACs) provide the interface between digital logic and the external analog world. One such application of digital-to-analog converters is the interface in hard disk drives between digital servo control circuits and analog voice coil motor control signals. These analog control signals control the radial position of the read/write heads on the disks. Data is stored on disks in concentric tracks. The voice coil motor moves the heads to tracks to read and write data. To increase storage capacity, track widths have been greatly reduced. The narrower tracks require greater DAC resolution to ensure that the heads are properly positioned over the tracks for data read/write operations.

DAC performance requirements are primarily based on resolution, speed and linearity. Linearity is a measure of a DAC's accuracy. One component of linearity is the extent to which the DAC output from the minimum value to the maximum value adheres to a straight line between those endpoints. A second component of linearity is the linearity between code transitions. A DAC is said to be monotonic if each increase in input value results in a corresponding change in the DAC output value. Linearity and monotonicity are critical in demanding applications such as disk drive servo control.

Pulse width modulation (PWM) DACs are often used where monotonicity is a critical requirement. In PWM DACs, n bits are provided as an input code to a pulse generator. The pulse generator also has a system clock input signal. The system clock frequency defines the minimum resolution of the DAC. The number of bits in the input code and the frequency of the clock determine the conversion period of the DAC. For example, typically an input code with only the least significant bit set corresponds to an output of one pulse for the DAC conversion period, and an input code with all of the bits set corresponds to an output of the maximum number of pulses in the conversion. PWM DACs provide highly reliable monotonicity because for a given finite resolution an additional pulse will increase the output value. To increase the resolution of a PWM DAC, the number of bits in the input code can be increased. However, to cover the full dynamic range, the conversion period includes one pulse period per input code bit. Therefore, for a given clock frequency, an increase in the resolution of a PWM DAC requires an increase in the conversion period. Alternatively, if a higher system clock frequency is used, a greater number of pulse periods could be included in a given conversion period. However, the maximum clock frequency that can be used is limited by semiconductor process technology and cost constraints. As a result in high speed, high resolution PWM DAC applications, the PWM DAC can limit the speed and accuracy of the system.

In contrast to PWM DACs, a flash DAC produces an analog value corresponding to a digital input immediately upon receipt of the digital input. The output then stays at a constant value until the digital input is changed.

One conventional type of flash DAC uses resistive ladder networks or R-2R networks, in which a digital word is used to control the switching of various points in resistive divider networks to generate the correct output voltage. One drawback with this type of structure is that the precision of the resistors effects the output, and therefore there is often a trimming step involved. The accuracy of trimming processes can create monotonicity limitations for high resolution implementations. Increasing the resolution of this type of flash DAC generally increases the cost due to larger circuit size and more demanding trimming requirements.

Another conventional type of flash DAC uses current sources of different ratios to generate the output voltages. In these DACs, limitations on transistor matching and ratios are limiting factors of the DAC accuracy and monotonicity for high resolution implementations.

In view of the foregoing problems and limitations, there is a need for improved PWM DACs.

SUMMARY OF THE INVENTION

An object of the present invention is therefore to improve the speed and resolution of pulse width modulation (PWM) digital-to-analog converters (DACs). The present invention provides a variable pulse pulse width modulation digital-to-analog converter comprising: an input code register to store a digital input code to be converted; a PWM decoder, coupled to the input code register, to convert the input code to a series of pulses; an output driver circuit coupled to the PWM decoder, wherein the output driver circuit generates an output signal comprising pulses of a high logic level and pulses of an intermediate logic level; and a filter to integrate the pulses to generate an analog output value corresponding to the digital input code. In one embodiment, the output stage comprises an active tri-state driver, a multiplexer and at least two output reference voltage sources.

In operation, a digital input code to be converted is loaded into the n-bit DAC register. When the Load signal input to the PWM decoder is asserted, the input code is loaded into n-bit PWM decoder. The PWM decoder converts the input code into a pulse train and corresponding Vref Select signals. The reference voltage sources define the amplitude of the pulse output of the multilevel active tri-state driver. Vref Select signals determine which of the reference voltage sources is coupled to the tri-state driver for each pulse the tri-state driver outputs to the filter. The Vref Select signal is comprised of a sufficient number of bit lines to enable each of the voltage references to be uniquely identified. Using a plurality of different amplitude pulse levels enables PWM DACs according to the present invention to provide greater resolution than conventional PWM DACs for a given clock frequency and conversion period.

In a further embodiment a plurality of output pulses are generated for each digital input code period. Providing more than one pulse per input period increases the resolution of the PWM DAC without increasing the frequency of the input data .

BRIEF DESCRIPTION OF THE DRAWINGS

Additional objects and features of the invention will be more readily apparent from the following detailed description and appended claims when taken-in conjunction with the drawings, in which:

DETAILED DESCRIPTION OF THE PREFERRED EMBODIMENTS

Figure 1:
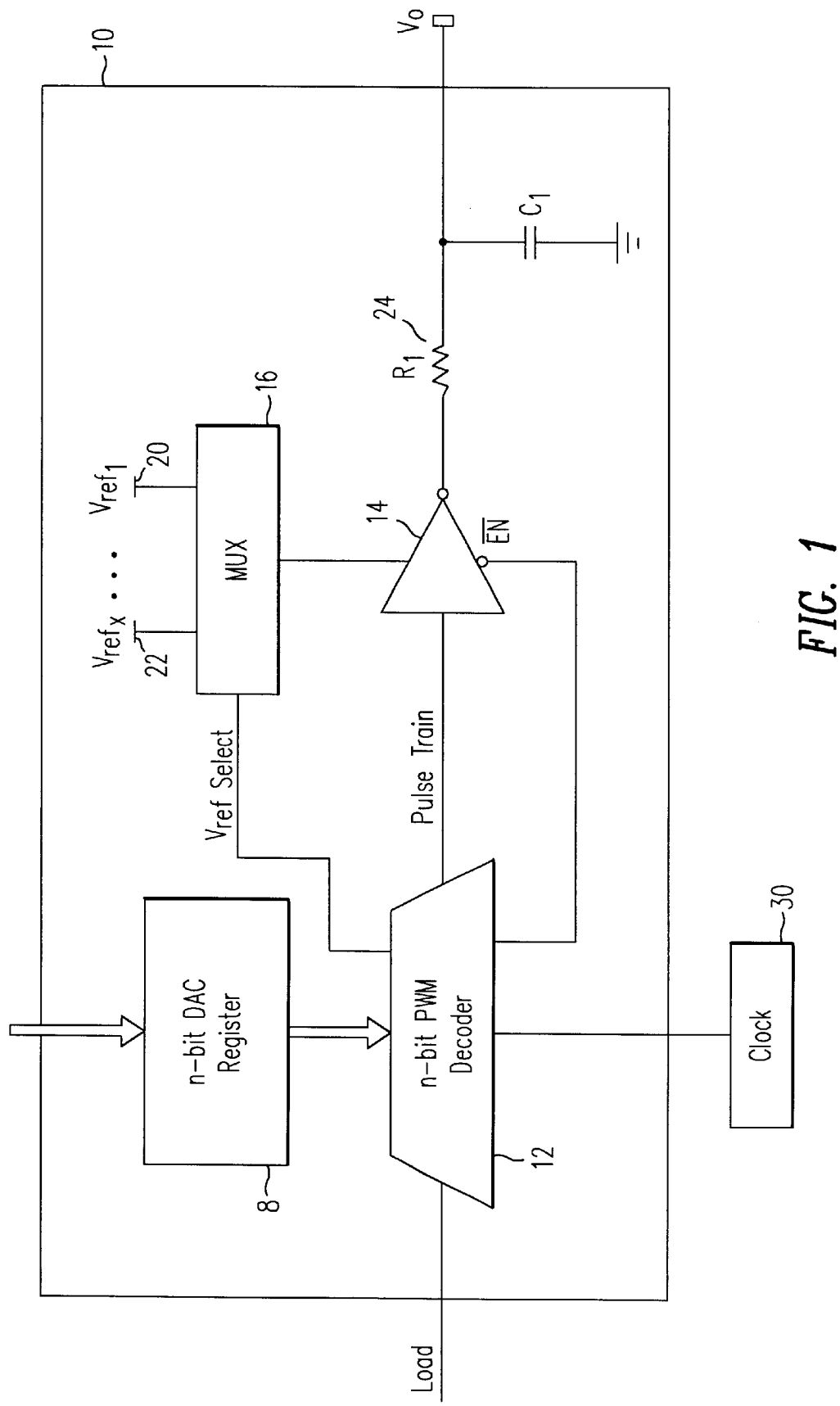
FIG. 1 illustrates a block diagram showing a pulse width modulation (PWM) digital-to-analog converter (DAC) according to one embodiment of the present invention.

FIG. 1 illustrates a block diagram showing a pulse width modulation (PWM) digital-to-analog converter (DAC) 10 according to one embodiment of the present invention. PWM DAC 10 comprises an n-bit DAC register 8, an n-bit PWM decoder 12, an active tri-state driver 14, a multiplexer 16, at least two output reference voltage sources 20 and 22, and a filter 24 comprising a resistor R1 and capacitor C1. The n-bit DAC register 8 is coupled to n-bit PWM decoder 12 via a set of bit lines with one bit line for each bit in the input code. As described below, the term PWM decoder is used broadly to refer to an input decoder that may generate variable pulse widths and or variable amplitude pulses.

In operation, a digital input code to be converted is loaded into n-bit DAC register 8. When the Load signal input to PWM decoder 12 is asserted, the input code is loaded into n-bit PWM decoder 12. PWM decoder 12 converts the input code into a pulse train and corresponding Vref Select signals, as for example shown in FIG. 2A and described in more detail below. Reference voltage sources $Vref_1$ through $Vref_x$ define the amplitude of the pulse output of multilevel active tri-state driver 14. The Vref Select signals determine which of the reference voltage sources is coupled to tri-state driver 14 for each pulse tri-state driver 14 outputs to filter 24. Filter 24 is represented by a resistor and a capacitor, however, as is known by those of ordinary skill in the art a wide range of active or passive components can be used to implement the filter. The Vref Select signal is comprised of a sufficient number of bit lines to enable each of the voltage references to be uniquely identified. Using a plurality of different amplitude pulse levels enables a PWM DAC 10 according to the present invention to provide greater resolution than a conventional PWM DACs for a given clock frequency and conversion period.

Figure 2A:
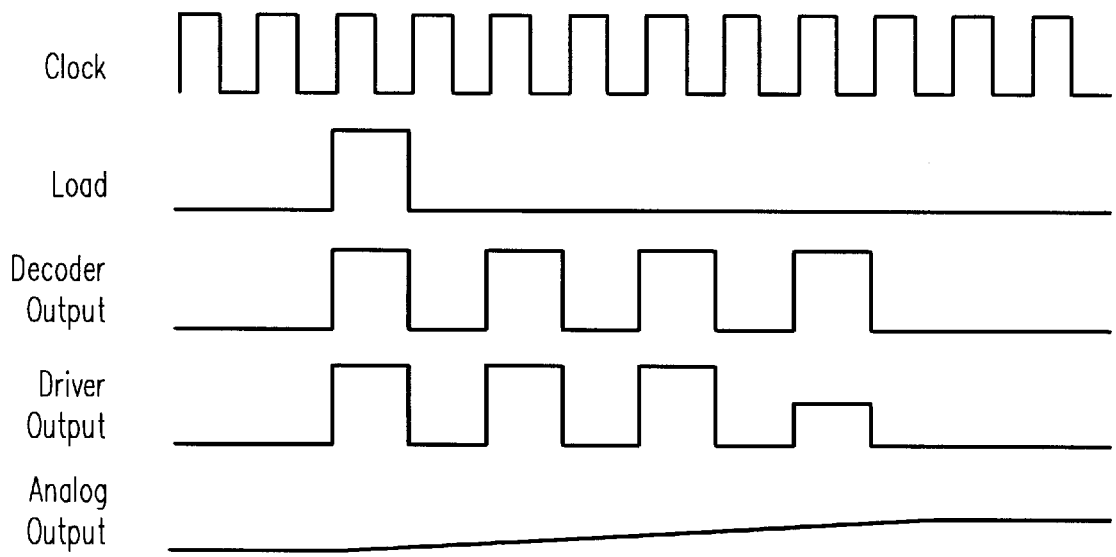
FIG. 2A illustrates a timing diagram for a PWM DAC according to one embodiment of the present invention.

FIG. 2A illustrates a timing diagram for a PWM DAC according to one embodiment of the present invention. In this embodiment two reference voltages are used with tri-state driver 14. The first reference voltage source is the positive voltage supply (Vcc) which in this embodiment is 5 V. The second reference voltage source is $Vcc/2$ V. A low logic level on the Vref select line selects the first reference voltage, and a high logic level selects the second reference voltage. For illustrative purposes the FIG. 2A timing diagram shows conversion of a digital input code value of seven. A single digit value is used for illustration purposes; in practice DACs with at least 12-bit resolution are commonly used as is well known by those of ordinary skill in the art. First, the Load signal is asserted to load the input code value, seven, into PWM decoder 12. The PWM decoder 12 converts the input code value of seven into three pulses at the PWM decoder 12 output and a single Vref Select pulse coincident with the third PWM decoder 12 output pulse. These output signals from PWM decoder 12 cause tri-state driver 14 to generate three high logic level pulses with an amplitude of Vcc corresponding to the first two PWM decoder 12 pulses, and a fourth intermediate logic level pulse with an amplitude of $Vcc/2$ V. The tri-state driver 14 output is then integrated by filter 24 to generate an analog output value corresponding to the input code value, seven.

A variety of different pulse decoding systems may be implemented in the present invention. For example, an increment of two may be represented by a single full amplitude pulse or two half-amplitude pulses. Also the additional reference voltage levels can be designed to be essentially any fraction of Vcc. Generally, using pulse amplitude values at equidistant intervals between the two supply rails is preferred. A further parameter of the decoding scheme is the distribution of the pulses in the conversion period. In a preferred embodiment the pulses are interleaved so as to be equidistantly distributed in the conversion period and thereby evenly distribute the energy in the output signal. Alternatively the pulse width can also be modified as part of the pulse decoding system. For example, an increment of two may be represented by a two system clock period wide pulse.

Figure 2B:
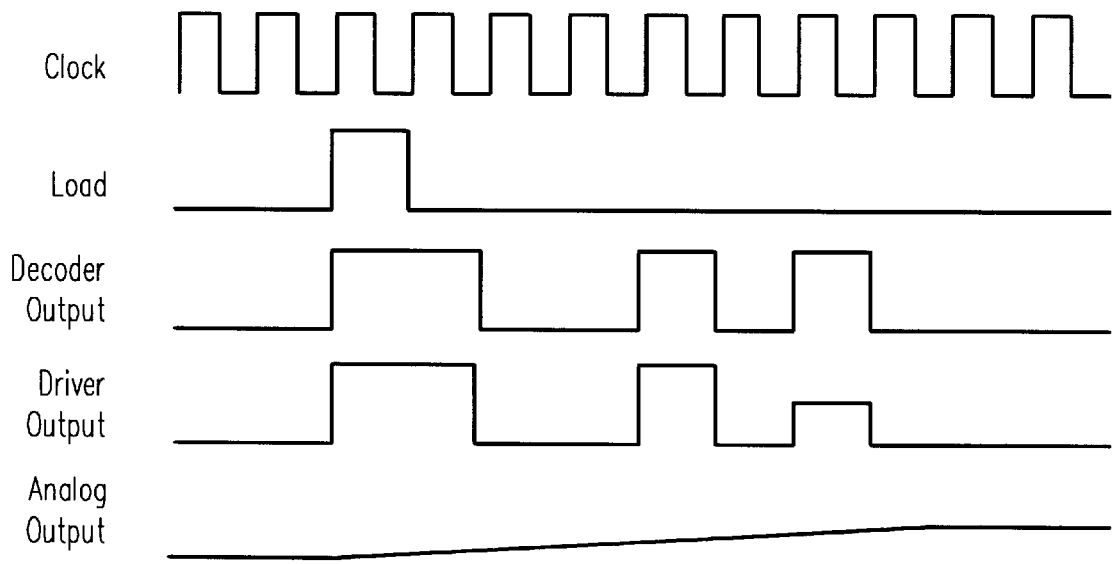
FIG. 2B illustrates a timing diagram of a PWM DAC according to a further embodiment of the present invention wherein pulse widths are modified to generate analog output values.

FIG. 2B illustrates a timing diagram of a PWM DAC according to a further embodiment of the present invention wherein pulse widths are modified to generate analog output values. As in the example of FIG. 2A, the input code value is seven. In the FIG. 2B embodiment, a pulse pattern corresponding to input code of seven, comprises a full amplitude pulse having a two clock cycle pulse width, a full amplitude pulse with a single clock cycle pulse width, and a half amplitude single clock cycle pulse width. These pulses are integrated to produce the same analog output level as in FIG. 2A corresponding to the input code of seven.

In a further embodiment a plurality of output pulses are generated for each digital input code period. Providing more than one pulse per input period increases the resolution of the PWM DAC without increasing the frequency of the input data.

In another embodiment, only a single pulse position is used for fractional pulse amplitudes. As is known by those of ordinary skill in the art, in some disk drive PWM DAC implementations one conversion period is handled differently than the others. For example, one technique is to produce 2n clock pulses per conversion period. The input is then a binary value B between 0 and 2n–1, and the output is a waveform with B pulses on, and 2n–1–B off. In these implementations, one clock pulse is always zero. In this embodiment of the present invention, a single fractional value clock pulse can be output by the pulse generator. Having a single fractional clock pulse or having a predetermined subset of the clock pulses in a conversion period be potentially fractionally valued enables less complex circuitry to be used.

The following provides a generalized approach for generating pulse patterns corresponding to digital input codes. The number of pulse amplitudes that a DAC can generate is defined as M. The conversion period is divided into N cycles where $N=(1+M+M^2+M^3+\ldots+M^{n-1})$; and n is selected to be a large enough number to provide the required DAC accuracy given the capability of generating M pulse amplitudes. In a 5 volt system, to output a given value between 0 and 5 volts, express the value as a fraction of 5 volts and then multiply by $M^n$. The expression of the resulting value in base M notation then corresponds to the pulse pattern, where each digit represents a pulse amplitude value to be output for a number of cycles based on the position of the digit. For example, representing the value in the following format $M_{n-1}M_{n-2}\ldots M_1M_0$; $M_0$ corresponds to a one cycle ($M^0$) pulse of value $M_0$, $M_1$ corresponds to an M cycle ($M^1$) pulse of value $M_1$. Pulses corresponding to each digit are thereby generated up to the value $M_{n-2}$ corresponding to an $M^{n-2}$ cycle pulse of value $M_{n-2}$.

An example of this method of defining pulse patterns with a PWM DAC of the present invention having a three value pulse generator or flash DAC, and a 5 volt power supply is as follows. For three value pulse generators M=3. For this example n=7 so that there are $1+3+3^2 \ldots +3^6=1093$ cycles per conversion period, and $3^7=2187$ output values. To generate a 1 volt output value:

(1 volt/5 volt)*2187=437

This is then converted to base 3 as follows:

$0*3\wedge6+1*3\wedge5+2*3\wedge4+1*3\wedge3+0*3\wedge2+1+3+2*1$ which in turn is represented in base 3(ternary) as (0121012). The pulse generator therefore generates a 0 (or 0 volts) valued pulse for 729+9 cycles, a 1 (or 2.5 volts) valued pulse for 243+27+3 cycles, and a 2 (or 5 volts) valued pulse for 81+1 cycles. The average output over one conversion period is then:

(273 cycles*2.5 volts+82 cycles*5 volts)*(1/1093 conversion period/cycle)=1 volt Also note that the resolution has been more than doubled with essentially the same clock rate and conversion period.

To provide a further example, if a four bit flash DAC is used to generate the pulse amplitude then M=4. If n is defined to be 5 then there are:

1+4+16+64+256=341 clock cycles and $3^5=1024$ values.

To generate a 1 volt output:

1 volt/5 volt*1024=205=(0*256)+(3*64)+(0*16)+(3*4)+(1*1)=03031 in base 4 notation.

As a result the pulse generator generates a 0 (or 0 volts) value pulse for 256+16 cycles, a 1 (or 1.67 volts) value pulse for 1 cycle, a 2 (or 3.33 volts) value pulse for 0 cycles, and a 3 (or 5 volts) value pulse for 64+4 cycles. The average output voltage over one conversion period is then:

((68*5)+(1*1.67))*(1/341)=1 volt average over a conversion period.

Figure 3:
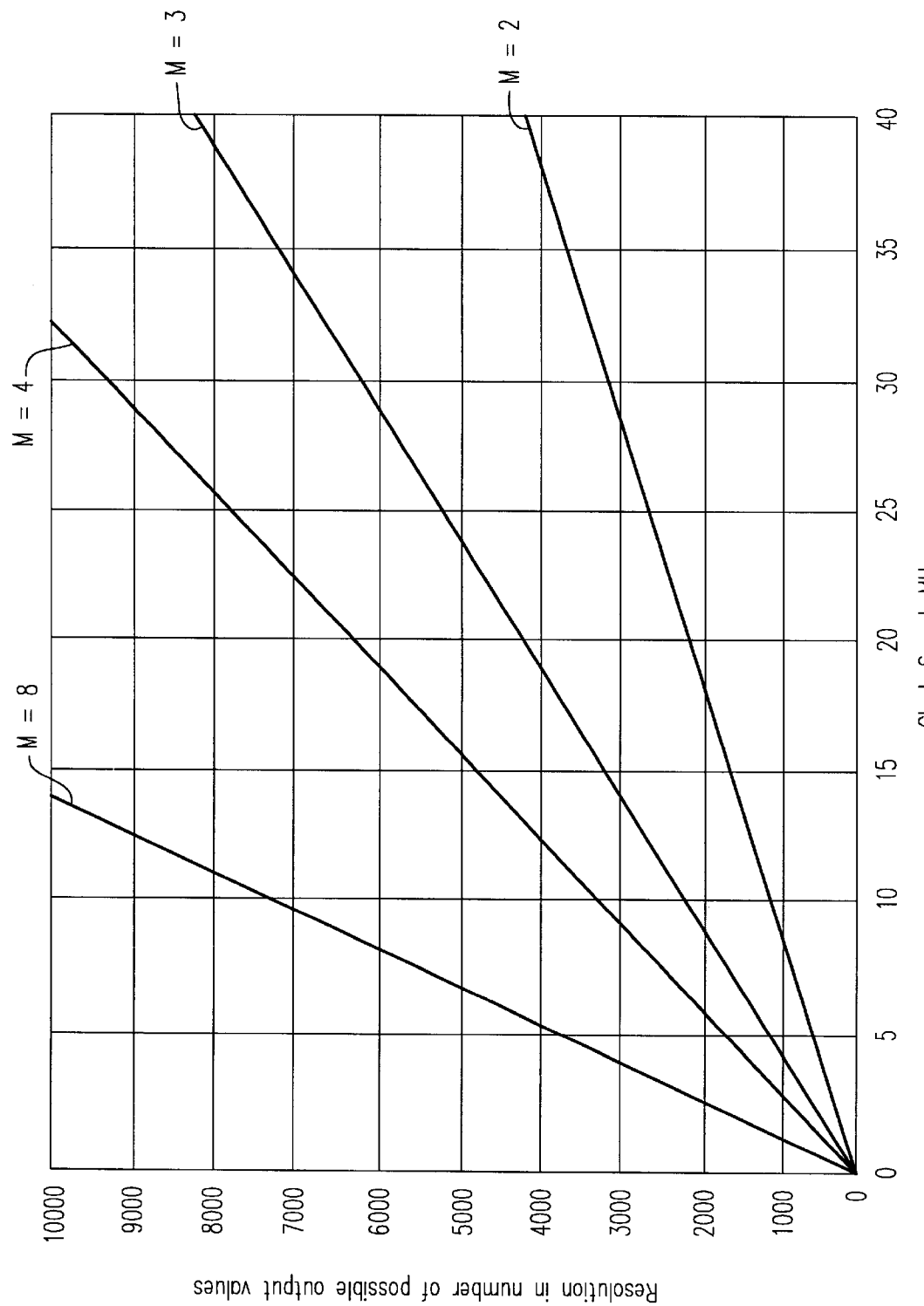
FIG. 3 illustrates a plot for several M-value pulse generators.

It is clear from the above three examples that as the number of output values that the pulse generator can provide increases, the required clock speed (or the length of the conversion period) to obtain a given resolution decreases. FIG. 3 illustrates a plot for several M-value pulse generators. This chart illustrates that changing from a two value pulse generator to a three value pulse generator doubles the resolution for about the same clock rate, and a four value generator increases the resolution by a factor of three. Alternatively, the length of the conversion period can be reduced.

Another way to illustrate this trend is the following table of resolution as a function of the number of values of the pulse generator.

| Pulse Generator Output Values | Cycles per Conversion Period | Resolution |
| --- | --- | --- |
| 2 | N | N + 1 |
| 3 | N | 2N + 1 |
| 4 | N | 3N + 1 |
| M | N | (M − 1) *N + 1 |

As shown by the general formula given in line four, each clock pulse offers one additional DAC value for each possible non-zero output value of the pulse generator, plus the case where all outputs are zero.

Another process to generate an analog voltage using an M-valued pulse generator is as follows. As before, a 5 volt output is generated by setting all of the n pulse cycles in the conversion period to M−1 (or 5V), and a 0 volt output is generated by setting all of the pulse cycles in a conversion period to 0 (or 0V). To increase the resolution, only one clock pulse period needs to have the ability to generate a value other than 0 or M−1. Consequently, the control circuitry can be the same as the original two-value pulse generator case, except for the special case of the one multivalued clock pulse.

In systems where the pulse period can be reduced, the frequency of the input to the pulse generator can be increased to increase the resolution of a PWM DAC according to the present invention. For example, a 10 bit flash DAC can generate 1024 different values with constant input, but if the input is changed twice in one conversion period, then there are 2047 different possibilities.

The process to generate an analog voltage using an M-valued pulse generator according to the present invention can be optimized for a particular implementation based on circuit complexity, frequency content of waveforms, phase delay of the output, and the number of required pulse generator values.

In a sample 12-bit implementation of the present invention in a hard disk drive, an 80 MHz system clock is used, which corresponds to a 12.5 nanosecond clock period. The 12 bits provide 4095 possible pulse location patterns over the conversion period. Therefore the conversion period for a conventional DAC is 4095*12.5 nanoseconds, which is approximately 51 microseconds. However, with an embodiment of the present invention having two reference voltages Vcc and $Vcc/_2$, a conversion period of less than 26 microseconds can be used for the same system clock frequency, twice the speed of the conventional DAC. Similarly, in embodiments using more than two reference voltage sources, still faster conversion speeds can be provided.

Figure 4:
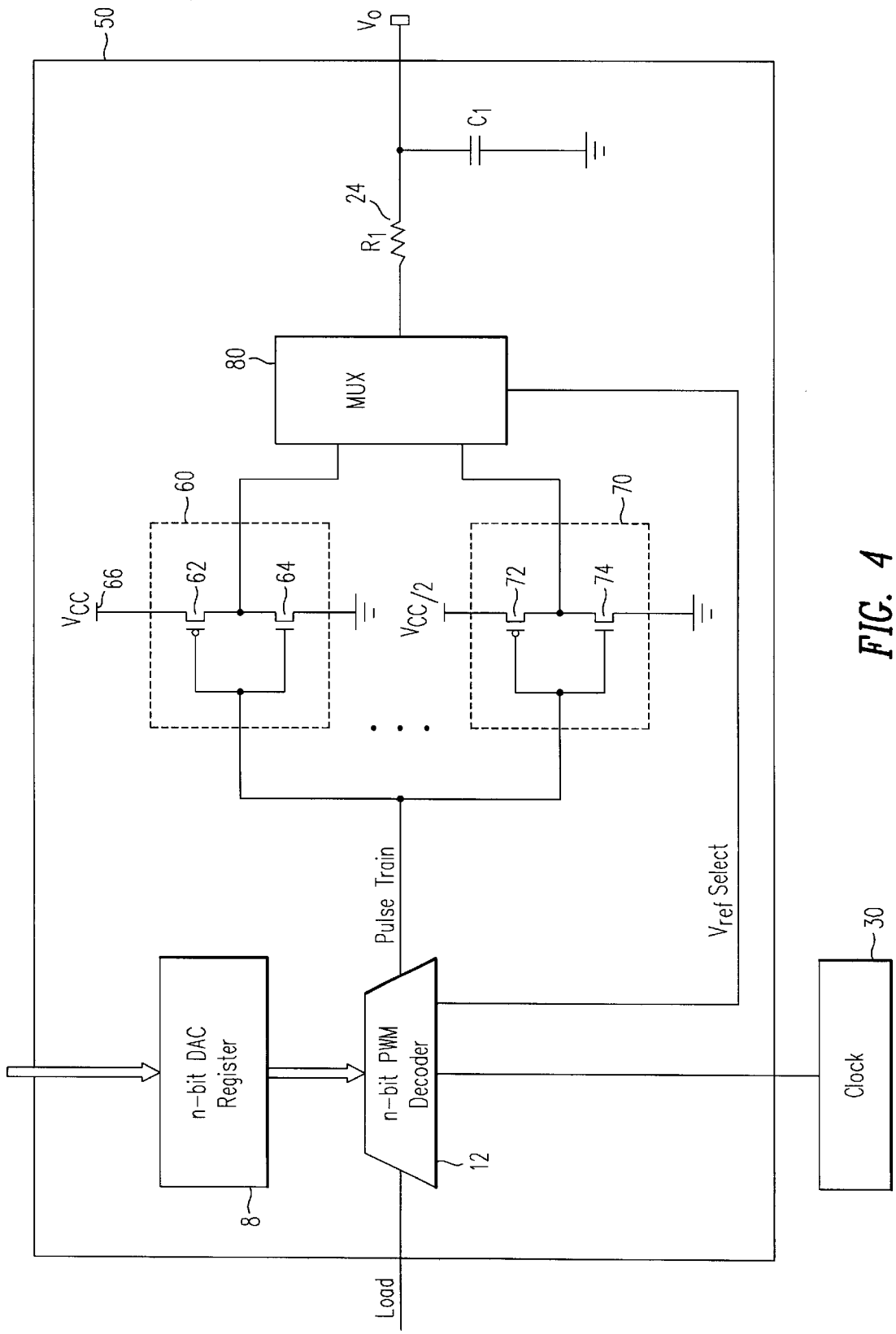
FIG. 4 illustrates a variable pulse PWM DAC 50 according to a further embodiment of the present invention.

FIG. 4 illustrates a variable pulse PWM DAC 50 according to a further embodiment of the present invention. PWM DAC 50 replaces the plurality of reference voltage sources 20 and 22 approach, shown in FIG. 1, with a plurality of voltage level drivers 60 and 70. Voltage level driver circuit 60 comprises a pull-up PMOS transistor 62 and an NMOS pull-down transistor 64. Pull-up transistor 62 is coupled to a power supply Vcc. Voltage level driver circuit 70 is similarly comprised of a pull-up transistor 72 and a pull-down transistor 74. However, pull-up transistor 72 is coupled to a reference voltage 76, $Vcc/_2$ V. The reference voltage value 76 determines the amplitude of output pulses from driver 70 and can be set to any available voltage level. Only two voltage level driver circuits are shown; however, as will be clear to those of ordinary skill in the art, additional circuits can be added to provide additional output pulse levels.

In operation, PWM decoder 12 provides a pulse pattern corresponding to the n-bit input code to each of the voltage level driver circuits 60, 70. The voltage level driver circuits convert the amplitude of the pulses to the voltage level of the pull-up voltage. These level shifted pulses are coupled to the inputs of multiplexer 80. The PWM decoder 12 provides control signals over the Vref Select lines to select which of the voltage level driver circuits outputs multiplexer 80 couples to the filter 24, and thereby determines the amplitude of the pulses provided to the filter 24. Filter 24 integrates the pulses over the conversion period to generate the analog voltage output level.

Figure 5:
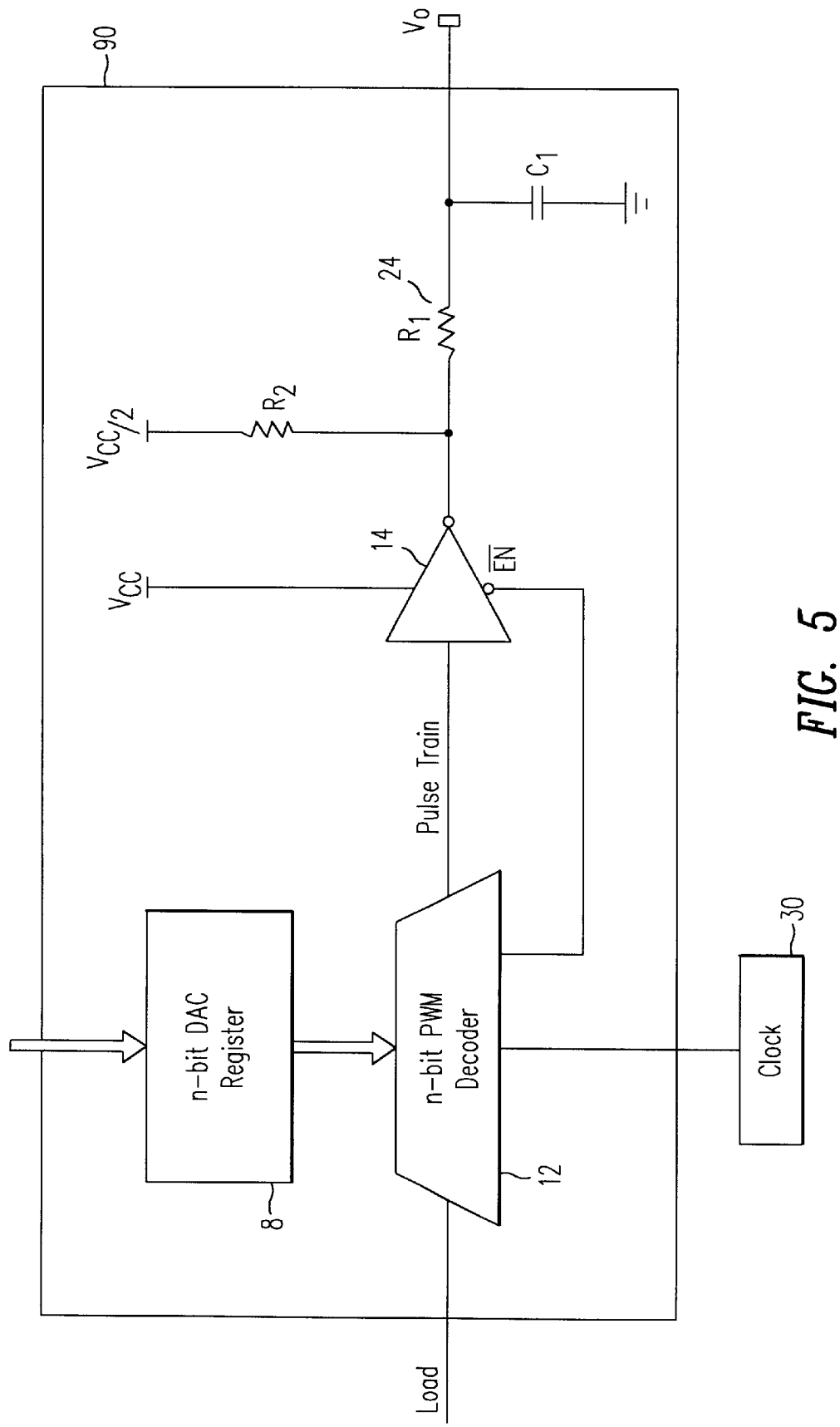
FIG. 5 illustrates a variable pulse PWM DAC 90 according to an alternative embodiment of the present invention.

FIG. 5 illustrates a variable pulse PWM DAC 90 according to an alternative embodiment of the present invention. In PWM DAC 90, an additional pulse amplitude level is defined by a resistor R2 pull-up to a reference voltage source, in this example $Vcc/_2$ V. In operation, full amplitude pulses are generated by tri-state driver 14 based on the Vcc voltage source. To generate pulses having a second amplitude defined by the reference voltage source, in this example $Vcc/_2$ V, tri-state driver 14 is placed into a tri-state mode by the active low output enable control signal, EN bar, the input to filter 24 is then pulled up to $Vcc/_2$ V. Resistor-pull up embodiments generally have longer pulse rise times than embodiments using active drivers for each pulse amplitude level.

Figure 6:
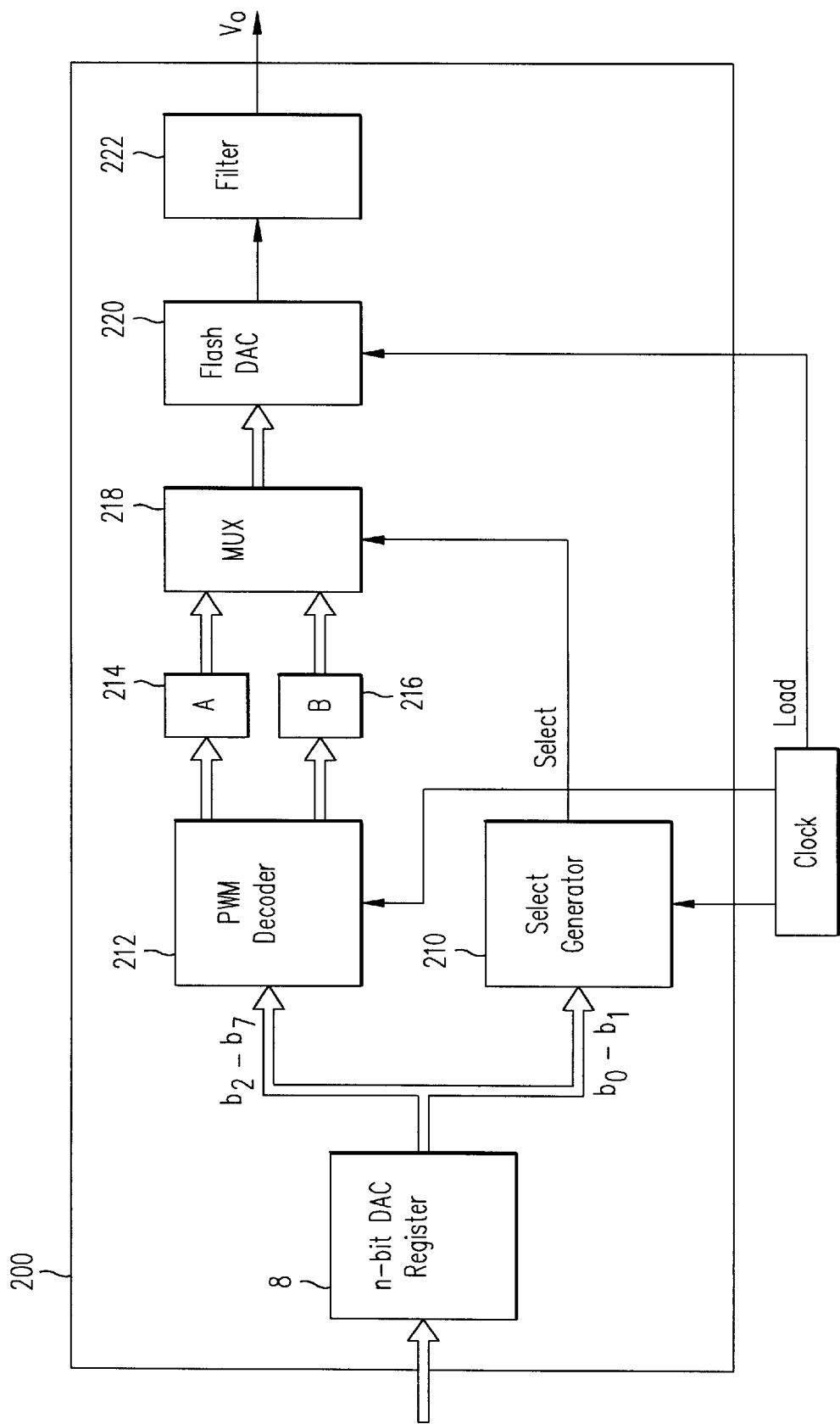
FIG. 6 illustrates a PWM DAC that uses a flash DAC variable pulse generator according to one embodiment of the present invention.

FIG. 6 illustrates a PWM DAC 200 that uses a flash DAC 220 variable pulse pulse generator according to one embodiment of the present invention. PWM DAC 200 comprises: n-bit DAC register 8, select generator 210, PWM decoder 212, register A 214, register B 216, multiplexer 218, flash DAC 220 and filter 222. PWM DAC 200 uses a six bit flash DAC to produce an eight bit value. The eight bit value $b_7 \ldots b_0$ is split into two parts: DAC input A, which is the upper six bits, and a select generation signal. The PWM decoder generates two six bit values: the input signal A (which is just a digital number) and a new digital value B=A+1; in this embodiment if A=111111, then B=111111 also, so as to avoid the overflow result of having B=000000 since it is only a six bit value. This is known as saturation arithmetic. The Select signal is a four clock cycle long signal. If $(b_1 b_0)$=(00) then Select is zero for all four clock cycles. If $(b_1 b_0)$=(01), then Select is one for one clock cycle and zero for three clock cycles. Similarly for $(b_1 b_0)$=(10) two cycles are zero and two cycles are two, and $(b_1 b_0)$=(11) where one cycle is zero and three cycles are one. The multiplexer selects A if Select is zero and B if Select is one. The flash DAC loads the new value each clock cycle, so the conversion time of the DAC must be faster than the clock rate. The average output of the filter is then proportional to $b_7 \ldots b_0$. In this embodiment the maximum value in the monotonic range is a $b_7 \ldots b_2$ value of (111110). In this case, the input to flash DAC 220 is (111111).

PWM DACs according to the present invention have a wide range of applications including high speed video displays, high speed signal processing, digital video tape recording, digital communication devices, digital attenuation, and high speed function generators.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of converting digital signals to analog signals comprising:
   receiving an input digital value;
   decoding said digital value;
   selecting a pulse pattern from a plurality of pulse patterns, based on said decoded digital value, wherein at least one of said plurality of pulse patterns comprises a pulse having a high logic level and a pulse having an intermediate logic level;
   generating pulses based on said pulse pattern by selecting for each pulse one reference voltage source from a group of at least two reference voltage sources so as to define the amplitude of each pulse in said pulse pattern and wherein one reference voltage source is a predetermined fraction of said second voltage source so as to generate a pulse having said intermediate logic level; and
   integrating said pulses over a predefined period so as to generate an analog signal level.

2. The method of converting digital signals to analog signals of claim 1 wherein only one pulse position is used for intermediate logic level pulses.

3. The method of converting digital signals to analog signals of claim 1 wherein said generating further comprises doubling a pulse width of a high logic level pulse so as to generate a two bit increase in the output analog signal value.

4. The method of converting digital signals to analog signals of claim 1 wherein said generating further comprises doubling a pulse width of a half amplitude pulse so as to generate a one bit increase in the output analog signal value.

5. The method of converting digital signals to analog signals of claim 1 wherein said pulses in said pulse pattern are distributed over a conversion period so as to approximately evenly distribute energy in said conversion period.

6. The method of converting digital signals to analog signals of claim 1 wherein said pulses are generated by an input decoder, and said input decoder has M pulse amplitude output levels, said input decoder generates pulses corresponding to a base M representation of the digital input code wherein each digit in the base M representation has an associated exponent corresponding to the value of the digit in the base M representation, and the number of pulses generated by said input decoder for a digit in the base M representation of an input code is based on the exponent of the digit.

7. The method of converting digital signals to analog signals of claim 1 wherein said generating further comprises outputting a plurality of pulses per input period of said receiving a digital value for at least one predetermined input digital value.

8. A variable pulse pulse width modulation (PWM) digital-to-analog converter (DAC) comprising:
   an input decoder, coupled to said input code register, to convert a digital input code to a series of pulses;
   an output driver circuit coupled to said input decoder;
   a multiplexer coupled to said output driver circuit;
   a first and second reference voltage source, each coupled to said multiplexer, wherein said output driver circuit generates an output signal comprising pulses of a high logic level corresponding to said first reference voltage source and pulses of an intermediate logic level corresponding to said second reference voltage source; and
   a filter to integrate said pulses to generate an analog output value corresponding to the digital input code.

9. The variable pulse PWM DAC of claim 8 wherein said output driver circuit outputs intermediate logic level pulses in only one pulse position.

10. The variable pulse PWM DAC of claim 9 wherein said input decoder provides a control signal to said multiplexer to determine the amplitude of an output pulse from said output driver circuit by selecting which of said voltage sources is coupled to said output driver circuit.

11. The variable pulse PWM DAC of claim 8 wherein said input decoder doubles a pulse width of a high logic level pulse so as to generate a two bit increase in the output analog signal value.

12. The variable pulse PWM DAC of claim 8 wherein said input decoder doubles a pulse width of a half amplitude pulse so as to generate a one bit increase in the output analog signal value.

13. The variable pulse PWM DAC of claim 8 wherein said input decoder generates a predetermined fractional amplitude pulse so as to increase the output analog signal value one bit.

14. The variable pulse PWM DAC of claim 8 wherein said input decoder distributes pulses in said series of pulses over a conversion period so as to approximately evenly distribute energy in said conversion period.

15. The variable pulse PWM DAC of claim 8 wherein said input decoder comprises a flash DAC.

16. The variable pulse PWM DAC of claim 8 wherein said input decoder has M pulse amplitude output levels, said input decoder generates pulses corresponding to a base M representation of the digital input code wherein each digit in the base M representation has an associated exponent corresponding to the value of the digit in the base M representation, and the number of pulses generated by said input decoder for a digit in the base M representation of an input code is based on the exponent of the digit.

17. The variable pulse PWM DAC of claim 8 wherein said input decoder outputs a plurality of pulses per input period of said input decoder for at least one predetermined input code.

18. A variable pulse pulse width modulation (PWM) digital-to-analog converter (DAC) comprising:
an input decoder, coupled to said input code register, to convert a digital input code to a series of pulses;
an output driver circuit coupled to said input decoder, wherein said output driver circuit generates an output signal comprising pulses of a high logic level and pulses of an intermediate logic level; and
a filter to integrate said pulses to generate an analog output value corresponding to the digital input code, wherein said input decoder has M pulse amplitude output levels, said input decoder generates pulses corresponding to a base M representation of the digital input code wherein each digit in the base M representation has an associated exponent, y, corresponding to the value of the digit in the base M representation, and the output voltage level of a pulse corresponds to a value of:

$$M^{y} * D / V_{mx}$$

where D is a value of the digital input code and $V_{mx}$ is a maximum output value of the input decoder.

19. The variable pulse PWM DAC of claim 18 wherein said input decoder comprises a flash DAC.

20. A method of converting digital signals to analog signals comprising:
receiving an input digital value;
decoding said digital value;
selecting a pulse pattern from a plurality of pulse patterns, based on said decoded digital value, wherein at least one of said plurality of pulse patterns comprises a pulse having a high logic level and a pulse having an intermediate logic level;
generating pulses based on said pulse pattern; and
integrating said pulses over a predefined period so as to generate an analog signal level;
wherein said pulses are generated by an input decoder, and said input decoder has M pulse amplitude output levels, said input decoder generates pulses corresponding to a base M representation of the digital input code wherein each digit in the base M representation has an associated exponent, y, corresponding to the value of the digit in the base M representation, and the output voltage level of a pulse corresponds to a value of:

$$M^{y} * D / V_{mx}$$

where D is a value of the digital input code and $V_{mx}$ is a maximum output value of the input decoder.

* * * * *